United States Patent [19]

Ueda et al.

[11] Patent Number: 4,518,959

[45] Date of Patent: May 21, 1985

[54] ELECTRONIC ANALOG DISPLAY DEVICE

[75] Inventors: Fumio Ueda; Yoshiaki Tsuboi; Hirotsugu Arai; Kenji Horikiri; Hiroaki Ideno, all of Hyogo, Japan

[73] Assignee: Mitsubishi Denki Kabushiki Kaisha, Tokyo, Japan

[21] Appl. No.: 377,768

[22] Filed: May 13, 1982

[51] Int. Cl.³ .............................................. G09G 3/34
[52] U.S. Cl. .................................... 340/784; 340/754; 340/792; 340/804
[58] Field of Search ............... 340/784, 753, 754, 792, 340/805, 804, 803; 368/242, 239, 240, 241

[56] References Cited

U.S. PATENT DOCUMENTS

| | | | |
|---|---|---|---|
| 3,275,871 | 9/1966 | Yiotis | 340/804 X |
| 3,614,771 | 10/1971 | Band | 340/762 X |
| 4,079,369 | 3/1978 | Fukumoto | 340/784 X |
| 4,212,011 | 7/1980 | Waldron | 340/784 |
| 4,227,193 | 10/1980 | Shanks | 340/784 |
| 4,240,074 | 12/1980 | Gibson et al. | 340/792 X |
| 4,250,503 | 2/1981 | Shanks | 340/784 X |
| 4,362,398 | 12/1982 | Jackson | 368/242 X |
| 4,386,351 | 5/1983 | Lowdenslager | 340/792 X |

Primary Examiner—Marshall M. Curtis
Assistant Examiner—Vincent P. Kovalick
Attorney, Agent, or Firm—Sughrue, Mion, Zinn, Macpeak & Seas

[57] ABSTRACT

A liquid crystal display is provided with elements arranged in matrix form and addressed by timing scanning and signal pulses so as to select particular display elements. According to input data, the display is made to move while maintaining its shape so that an analog of a mechanical system such as a dial or gauge having a movable pointer may be obtained.

8 Claims, 13 Drawing Figures ent electronics analog display device

ELECTRONIC ANALOG DISPLAY DEVICE

BACKGROUND OF THE INVENTION

This invention relates to an electronic analog display device including an electronic display unit such as a liquid crystal display unit, in which numerical data to be displayed on a display device are displayed as analog data such as patterns by a driving method according to a two-dimensional matrix address system.

Heretofore, an analog display device having an electronic display unit such as a liquid crystal display has displayed analog data according to a lighting method in which some of the display elements forming the display unit are turned on, or a number display elements in alignment are turned on. It has been attempted to selectively operate the display elements according to the former lighting method so that the configuration of the display elements thus operated appears similar to a pointer of a mechanical analog display device; that is, like the moving hand of a clock.

U.S. Pat. No. 4,044,345 to Ueda, commonly assigned, discloses a method of addressing display cells arranged in an X-Y matrix which is similar to the addressing method of the invention. In this patent, the scanning voltages applied to the scanning electrodes assume a high level during only one particular time slot of a given cycle. The signal voltages are varied in the slots having the high level so as to effectively select elements of the display which will and will not receive a voltage in excess of the threshold.

Also in an article by Shanks et al., *Displays*, April, 1979, p. 33+ entitled "Non-Multiplexed Addressing Methods for Liquid Crystal Oscilloscope Display ", there is discussed a liquid crystal display for use as a replacement of a conventional oscilloscope CRT, which again uses an addressing method and a display apparatus somewhat similar to the invention.

However, the conventional analog display devices are disadvantageous in that when it is required to display a mechanical configuration, such as for instance the configuration of the hand or pointer of a clock, with the display elements, it is impossible to smoothly display the movement of the pointer because the display elements for displaying the pointer must be arranged in one and the same plane without being overlapped. In order to overcome this drawback as much as possible, an analog display device has been proposed in the art, in which, among a series of display elements, a predetermined number of serial ones are lighted in a manner such that only two display elements at the front and rear ends are changed at a time, to display a smooth movement. However, this device is also disadvantageous in that the configuration of the displayed pattern is too rough to be recognized as a pointer.

SUMMARY OF THE INVENTION

An object of this invention is to eliminate the abovedescribed drawbacks accompanying conventional electronic analog display devices. More specifically, an object of the invention is to provide an electronic analog display device which includes a display unit having two-dimensionally arranged display elements and a signal multiplexer connected to the display unit which is designed so as to allow the coordinates of the position of a group of selected display elements to correspond proportionally to numerical data to be displayed, whereby a pointer display pattern more similar to the actual configuration of a mechanical pointer and the movement thereof may be displayed.

DETAILED DESCRIPTION OF THE PREFERRED EMBODIMENTS

Figure 1:
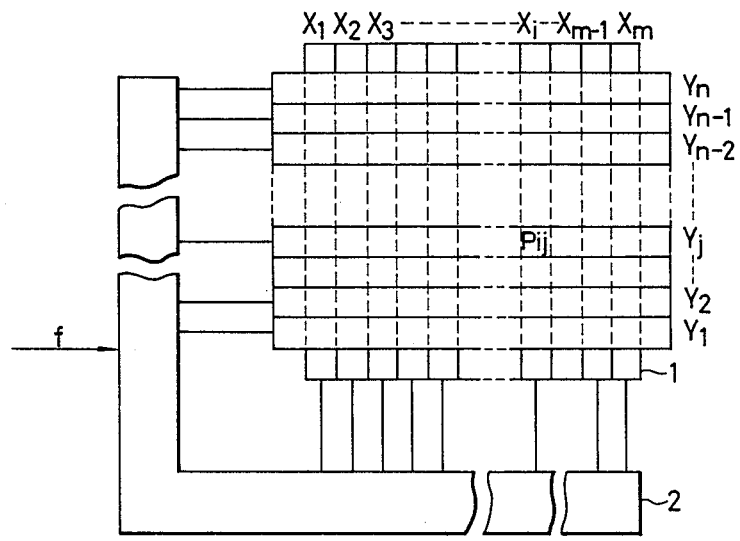
FIG. 1 is an explanatory diagram showing the fundamental arrangement of a typical embodiment of this invention.

In FIG. 1, reference numeral 1 designates an X-Y two-dimensional matrix electrode type liquid crystal display unit having a liquid crystal layer which is interposed between m belt-shaped transparent electrodes $x_i$ ($i=1, 2, 3, \ldots$) and n belt-shaped transparent electrodes $Y_j$ ($j=1, 2, 3, \ldots n$). The two groups of transparent electrodes $X_i$ and $Y_j$ are arranged orthogonally so that the transparent electrodes $X_i$ and $Y_j$ form display elements $P_{i,j}$ at the intersections thereof, each of which exhibits an optical response corresponding to the effective value of the voltage applied across the terminals.

The most ordinary liquid crystal display unit is provided with a polarizing plate in order to visualize the optical response of the liquid crystal layer and requires a glass plate which is a substrate on which the transparent electrodes $X_i$ and $Y_i$ are formed. However, these components are not shown in FIG. 1, because they have no direct relation to the subject matter of the invention.

Further in FIG. 1, reference numeral 2 designates a signal multiplexer which selectively applies to the transparent electrodes $X_i$ and $Y_j$ according to the numerical data to be displayed, and according to a predetermined algorithm, pulsive potentials $e_k$ ($k=1, 2, \ldots$) whose mutual potential difference exceeds the threshold voltage of the electro-optical characteristic of each display element $P_{i,j}$.

Figure 2:
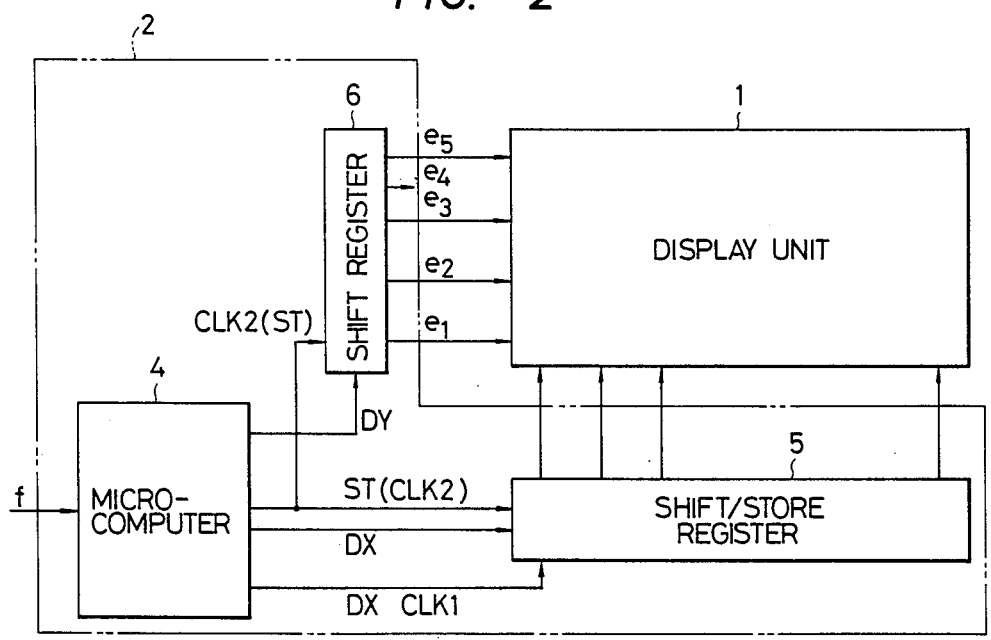
FIG. 2 is a block diagram illustrating the arrangement of the embodiment of FIG. 1.
Figure 3:
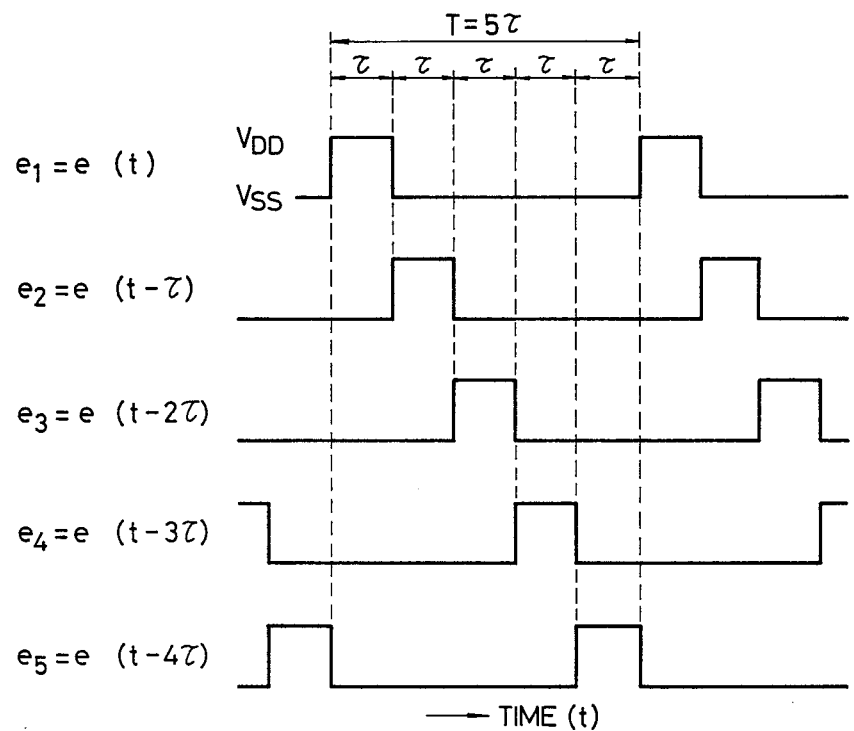
FIG. 3 is a diagram showing the drive waveforms for the display elements which are selectively produced by a signal multiplexer.
Figure 13:
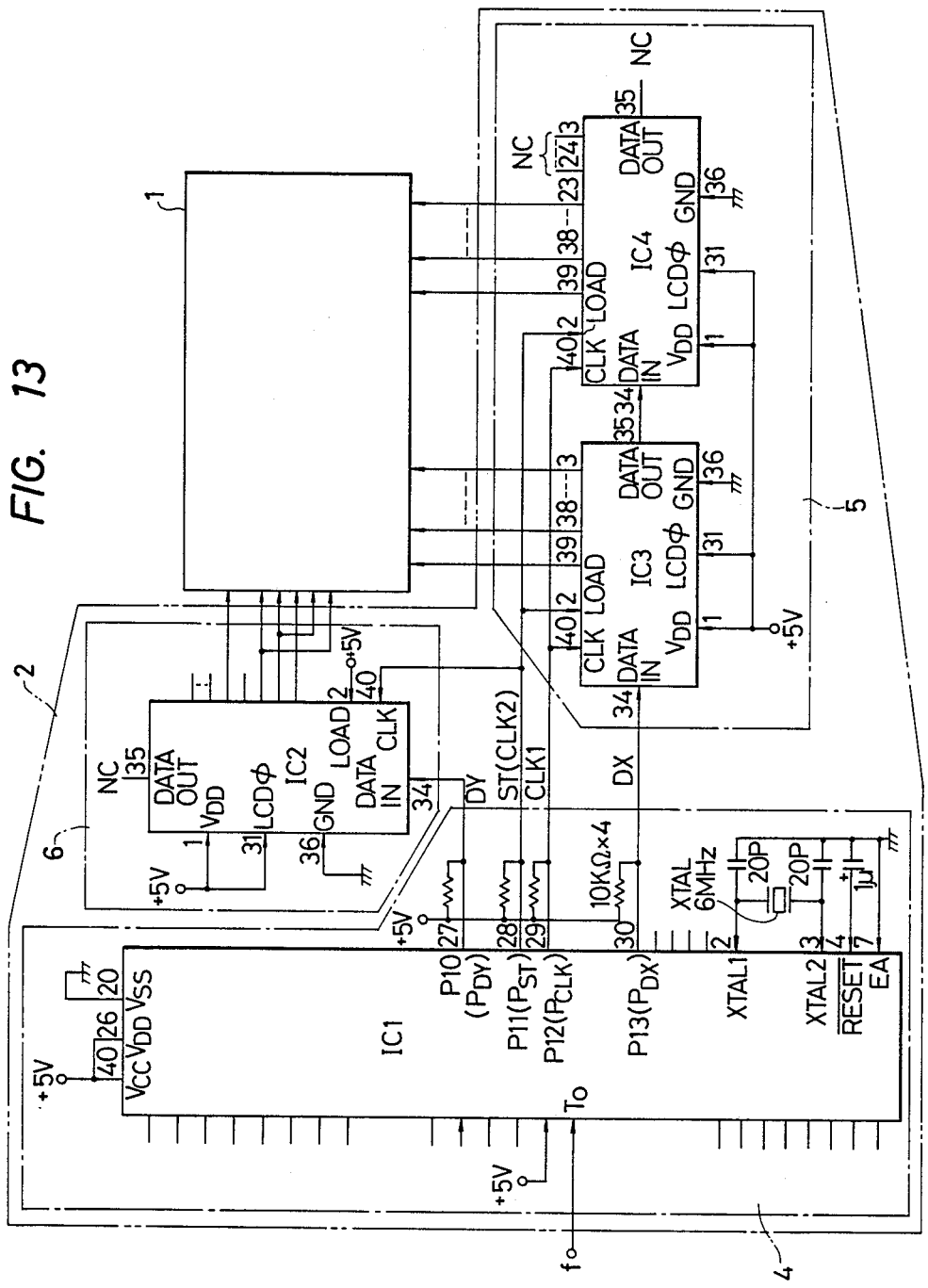
FIG. 13 is a circuit diagram showing details of the block diagram of FIG. 2.

The signal multiplexer 2, as shown in FIG. 2, includes a microcomputer system 4; a shift/store register 5; and a shift register 6, for instance. As shown in FIG. 13, which is a detailed circuit diagram of the circuit of FIG. 2, the shift/store register 5 includes integrated circuits IC3 and IC4 and the shift register 6 is an integrated circuit IC2. An HLCD 0438A may be employed as the integrated circuit in each instance. The signal multiplexer 2 produces pulsive potentials $e_k$ as shown, for instance, in FIG. 3 (in this case, $k=1, 2, \ldots 5$) according to the numerical data to be displayed. The pulsive potentials $e_k$ are applied to the liquid crystal display unit 1.

The amplitude of the pulsive potential is selected by setting the supply voltage of the system to a suitable value so that the effective value of $e_k-e_{l\neq k}$ exceeds the threshold voltage $V_{th}$ of the liquid crystal display unit 1.

In the circuit shown in FIGS. 2 and 13, the microcomputer system 4 receives a pulse signal and outputs a clock pulse $CLK_1$ which is applied to the clock input terminal of the shift/store register 5. The microcomputer system 4 further outputs a strobe pulse $ST(CLK_2)$ which is applied to the strobe input terminal of the shift/store register 5 and to the clock input terminal of the shift register 6.

Data DX and DY produced by the microcomputer system 4 are applied to the data input terminal of the shift/store register 5 and the data input terminal of the shift register 6, respectively.

The microcomputer system 4 has at least a register $\phi$, a register $R_N$, a register $R_n$, a register $R_m$ and fixed memories $ROM_1$ through $ROM_5$ (not shown). These elements are included in an IC chip D 8748 or D 8048 for instance. The frequency data N of an input f, which is obtained via an event counter, is stored in the register $R_N$.

The number of clock pulses $CLK_1$ produced, i.e., a number n corresponding to the address of data DX produced at a given time instant is stored in the register $R_n$.

The state number m of a waveform, which is obtained as a parallel output of the shift/store register 5, is stored in the register $R_m$.

Bit patterns corresponding to the waveforms of the pulsive potentials $e_1$ through $e_5$ are stored in the fixed memories $ROM_1$ through $ROM_5$, respectively.

The microcomputer system 4 obtains the data N through the procedure described below. The microcomputer system 4 is programmed so as to apply the data DX and DY and the pulses $CLK_1$ and $ST(CLK_2)$ to a group of ports PDX, PDY, PCLK AND PST shown in FIG. 13.

(1) The type of pulsive potential waveform to be provided is determined from a comparison of N and n.

(2) A bit pattern corresponding to the waveform thus determined is transferred into the register $\phi$ from the relevant one of the fixed memories $ROM_1$ through $ROM_5$.

(3) The m-th bit in the content of the register $\phi$ is applied to the port PDX.

(4) A signal "0" is applied to the port PCLK, followed by a signal "1".

(5) The content n of the register $R_n$ is decreased by one.

(6) If the content n of the register $R_n$ is not zero, the operations of steps 1 through 6 are again carried out. If it is zero, then the following step is carried out.

(7) The m-th bit in the bit pattern corresponding to the waveform of the pulsive potential $e_5$, which is stored in the fixed memory $ROM_5$, is applied to the port PDY.

(8) If the content m of the register $R_m$ is not zero, then the content m is reduced by one. If it is zero, then $m_{MAX}$ (which is four (4) in this case) is set in the register $R_m$, the content N of the event counter is transferred to the register $R_N$, and the content of the event counter is cleared.

(9) A signal "1" is applied to the port PST, followed by a signal "O".

(10) $n_{MAX}$ (which is fifty (50) in this case) is set in the register $R_n$.

(11) The operations of the steps 1 through 10 are again carried out.

In the shift/store register, the data DX are received, in a serial mode, by the shift register in response to the clock $CLK_1$, and the data DX thus received are simultaneously latched in the store register in response to the strobe pulse ST. The data thus latched are supplied to the electrodes $X_i$ of the liquid crystal display unit 1, respectively.

The shift register 6 receives the data DY in a serial mode with the strobe pulse ST ($CLK_2$) as a clock pulse. The contents of the first, second, third and fifth stages in the shift register 6 are supplied, as $e_1$, $e_2$, $e_3$ and $e_5$, to the electrodes $Y_1$ through $Y_{12}$ of the liquid crystal display unit 1, with the signal $e_4$ being reserved for use only with the electrodes $X_1$ through $X_{50}$.

Figure 5:
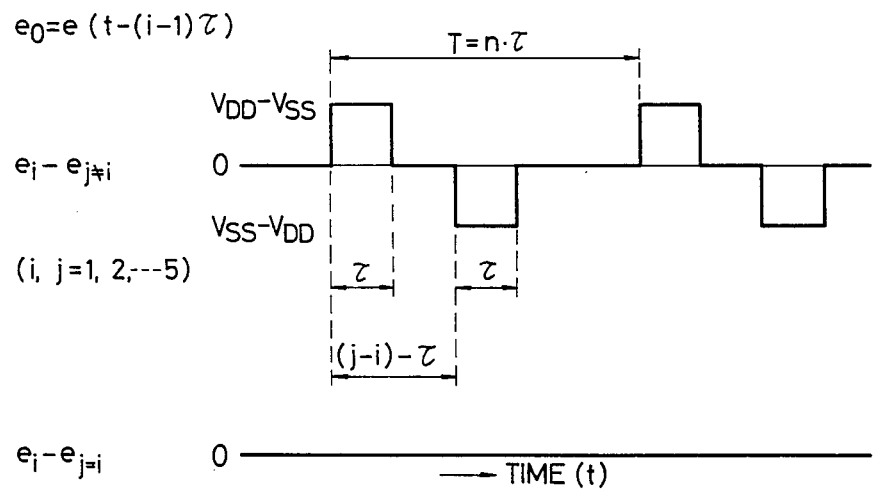
FIG. 5 is a time chart showing voltage waveforms applied to the display elements in this embodiment.
Figure 4:
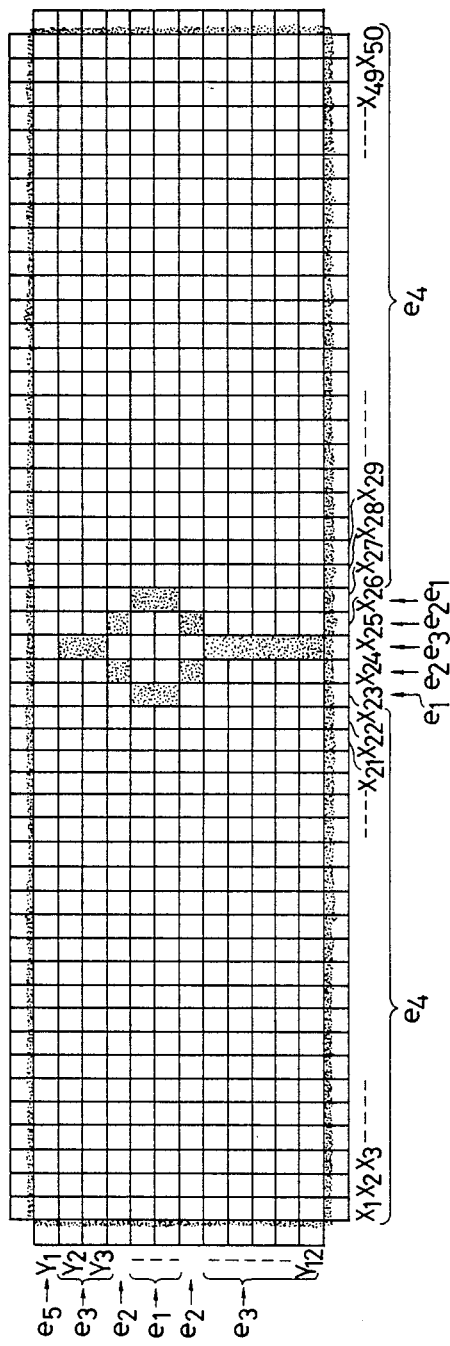
FIG. 4 is a diagram of one example of a pattern displayed according to the invention.
Figure 6:
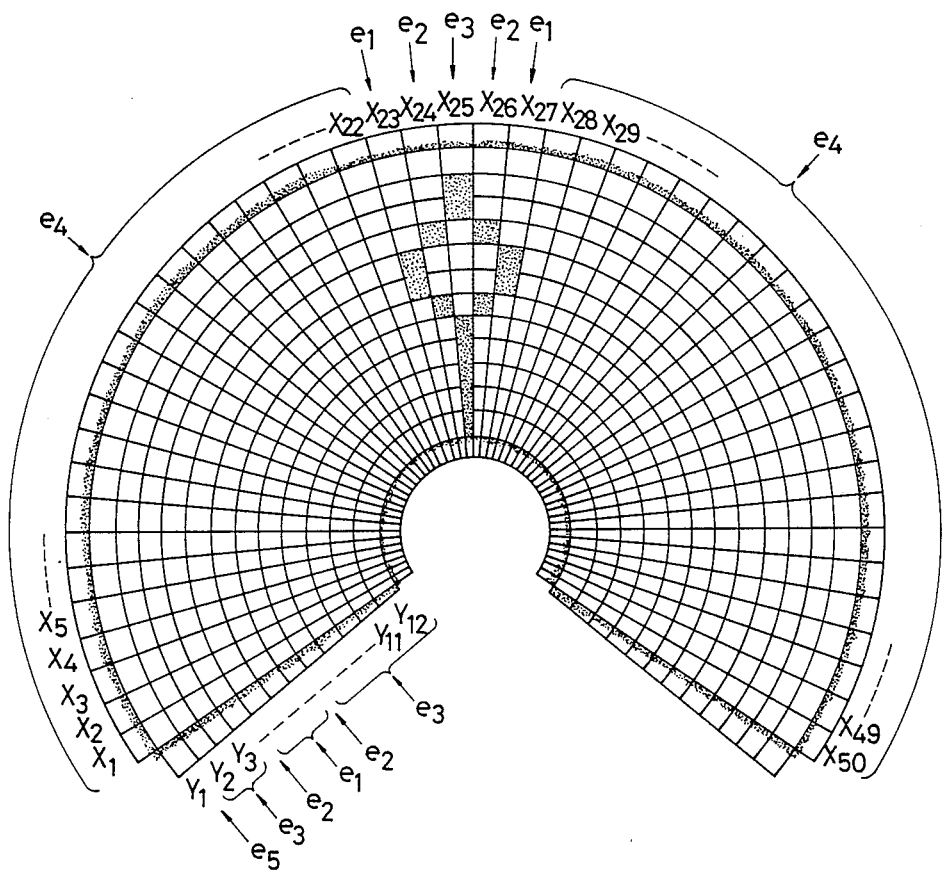
FIG. 6 is a diagram of another example of a pattern displayed according to the invention, which corresponds to the pattern of FIG. 4.
Figure 7:
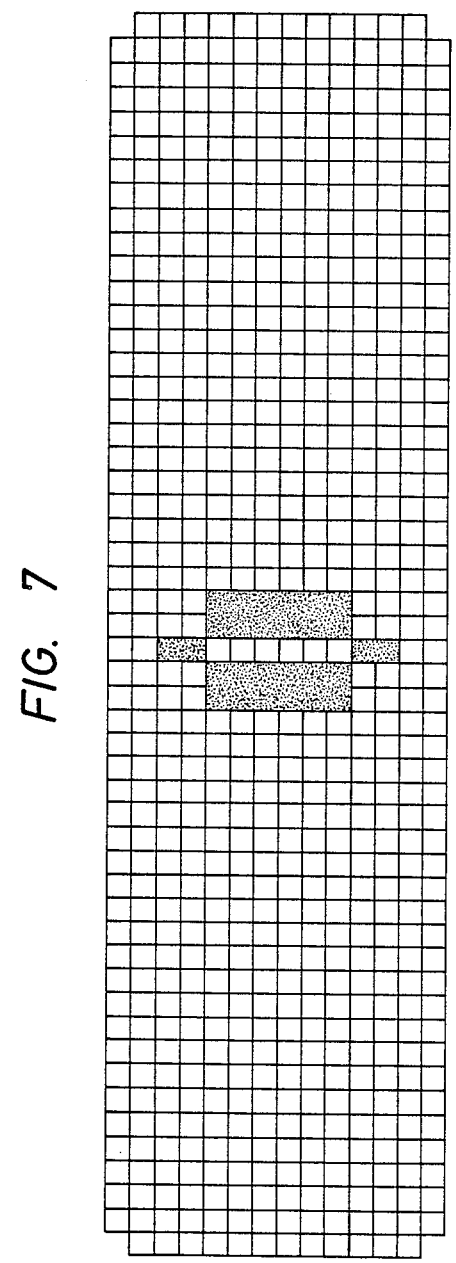
FIGS. 7, 8, 9, 10, 11 and 12 are diagrams showing other examples of patterns displayed according to the invention.
Figure 8:
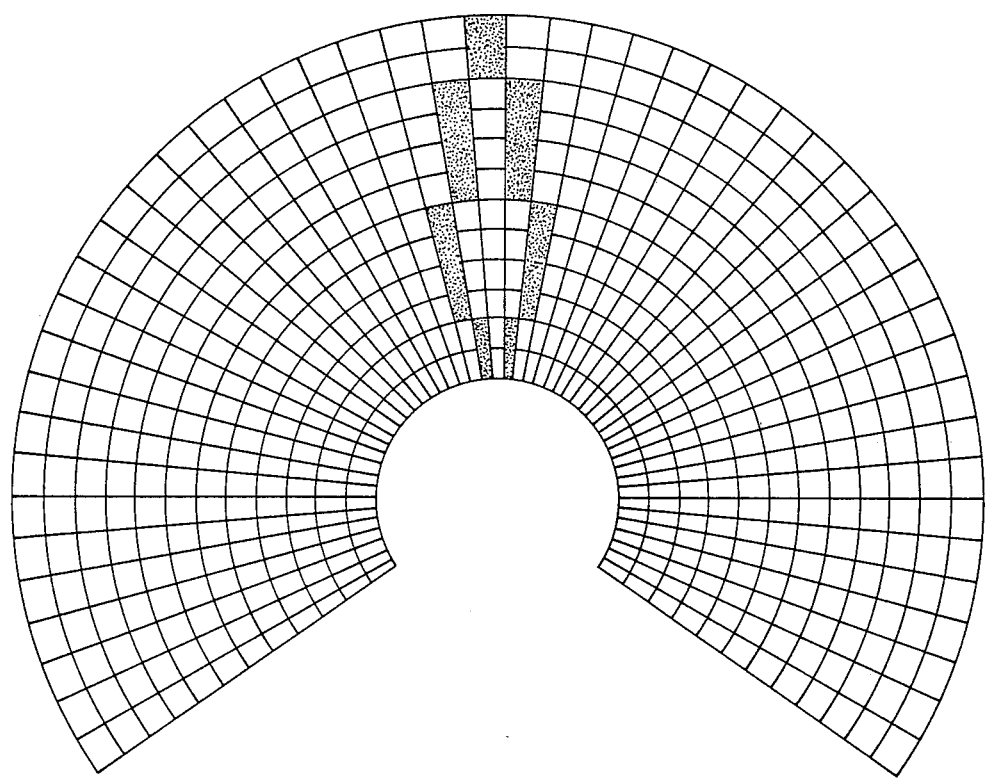
Figure 9:
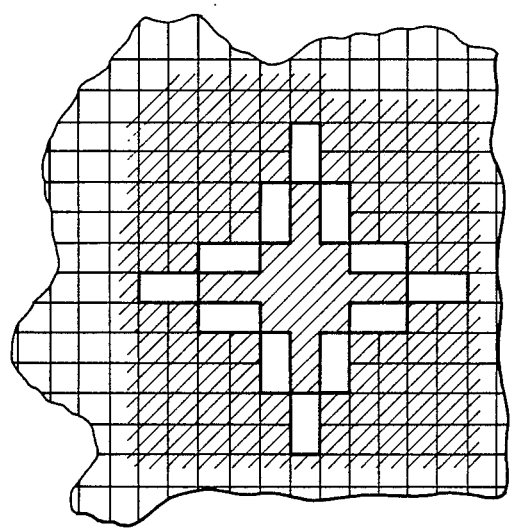
Figure 10:
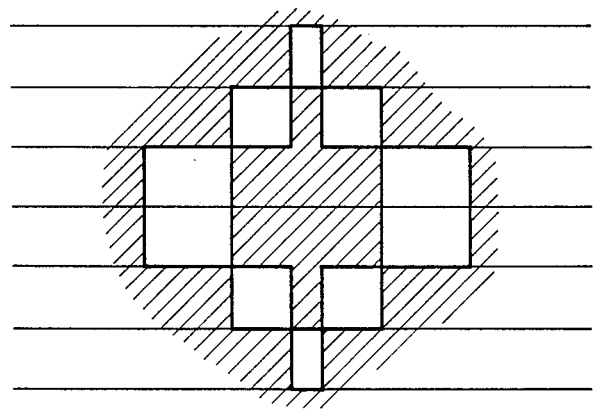
Figure 11:
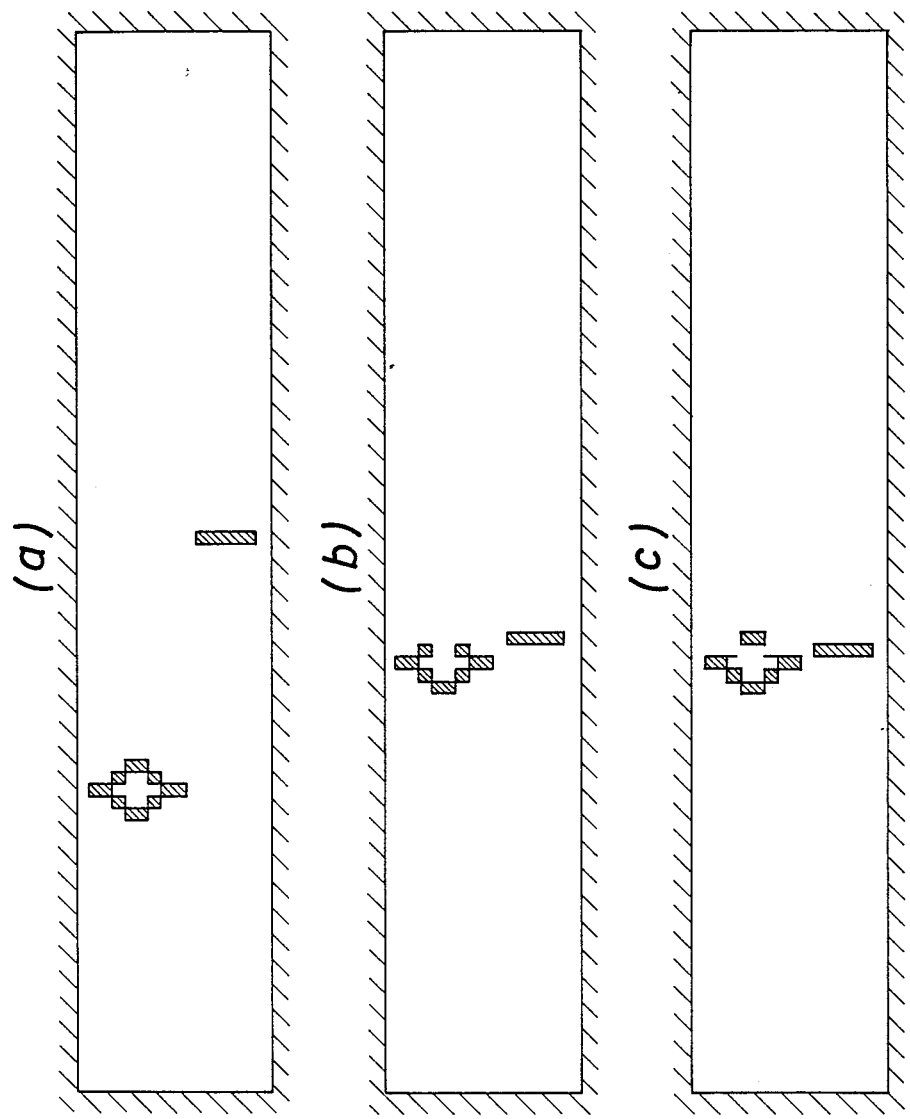
Figure 12:
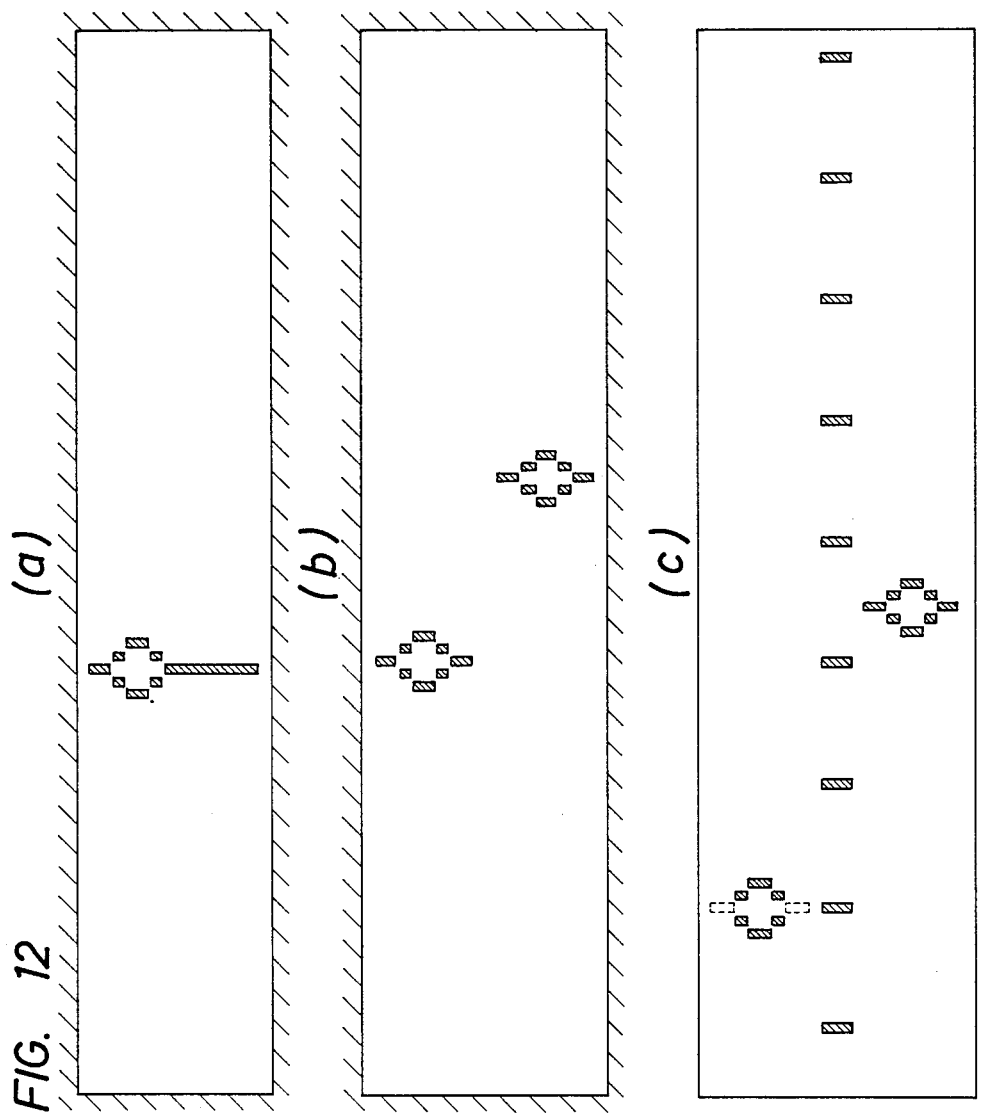

By the above-described arrangement and operation, five different pulsive potentials $e_1$ through $e_5$ are supplied to the electrodes $X_1$ through $X_{50}$ and the electrodes $Y_1$ through $Y_{12}$ of the liquid crystal display unit as shown in FIG. 4. The displayed value in FIG. 4 is "25", corresponding to the number N=25 to be displayed. No voltage is applied to the display elements which are shaded as shown in FIG. 4, and therefore the display elements show no optical response. On the other hand, $e_k-e_{l\neq k}$ (K=1, 2, ... 5, and l=1, 2, ... 5) is applied to the remaining display elements, and therefore these display elements show an optical response. (cf. FIG. 5) It goes without saying that the display elements of the liquid crystal display unit 1 may be arranged as shown in FIG. 6. FIG. 6 shows one example of a pointer-shaped display pattern; however, of course, different patterns can be displayed, typical examples thereof being shown in FIGS. 7 through 12.

If the number of transparent electrodes $Y_j$ is set to a suitable value, the outputs of the stages of the shift register 6 are connected to the transparent electrodes $Y_j$, and algorithm of the data DY is varied in accordance with a second input signal and the phase of the data DY is shifted by clock interval CLK2 as a minimum unit so that positions, in a vertical direction, of a display pattern correspond to the second input signal, it is possible to move the display pattern two-dimensionally. Furthermore, the configuration and size of the display pattern itself may be allowed to correspond to a second or third input level, or a plurality of display patterns may be displayed in a multiplex mode simultaneously or in a time division mode in correspondence to a plurality of values to be displayed, by changing or modifying the inputs from the mocrocomputer system or the program of the latter. It goes without saying that these uses fall within the scope of the invention. The method of driving the liquid crystal display unit described above is novel in and of itself, apart from the analog display device of the invention, due to the following reason: In the method, although the two-dimensional pattern display drive is effected with X-Y matrix electrodes, the application of the drive voltage is realized similarly to that in a display method according to the so-called "direct drive system" in which a lead-out element is provided for every display element, so that the display elements are operated directly by selective voltage application, whereby a high operating efficiency and a high response speed are obtained. This is obvious from the fact that, in FIG. 4, the pulsive potentials are applied equally to both the electrodes $X_i$ and $Y_j$ of the liquid crystal display unit.

The invention is not limited to only the above-described display method. That is, a display drive method according to a conventional scanning system is included within the scope of the invention, if it moves the positions of a group of displayed elements in correspondence to an input level to be displayed. The elements are selected so as to form a two-dimensional pattern when the voltage applied thereto exceeds the threshold value of the electro-optical elements.

In the above-described embodiment of the invention, a liquid crystal display element is employed. However, it will be readily understood that the technical concept of the invention is applicable to fluorescent display tubes, light emitting diodes or plasma display elements which are arranged two-dimensionally, as a display unit.

Thus, according to the invention, an electronic analog display device can be provided which can accurately display the configuration of a mechanical meter and the pointer thereof, as well as smooth movement of the pointer. Furthermore, according to the invention, a display device can be provided which, in the display of analog data in a multiplex mode, the configuration of a pointer can be changed according to different modes.

What is claimed is:

1. An electronic analog display device for displaying a display pattern having a predetermined configuration, the position of said predetermined configuration in said display being variable in accordance with an input signal, said device comprising:
   a display unit including a two-dimensional array of a plurality of electro-optical display elements each energizable in accordance with signals applied to its two inputs;
   coupling means for coupling one input of each element in a row to a corresponding row conductor extending in a row direction, and for coupling another input of each element in a column to a corresponding column conductor extending in a column direction; and
   control means for applying to each row and column conductor one of a predetermined number of control signals selected in accordance with the value of said input signal, said predetermined number being less than the number of said row and column conductors, to select a group of said elements defining said predetermined configuration at a position along said row direction which varies in accordance with the value of said input signal.

2. A display device as claimed in claim 1, wherein each element in said group of elements receives one of said control signals applied in common to both of its inputs.

3. A display device as claimed in claim 1, wherein said predetermined configuration comprises a pointer and said group of selected display elements are moved to simulate the motion of a moving mechanical pointer.

4. A display device as claimed in claim 1, wherein said control means comprises first register means (6) for providing said control signals to said row conductors and second register means (5) for providing said control signals to said column conductors; and microprocessor means for controlling the contents of said first and second register means in accordance with the value of said input signal.

5. A device as claimed in claim 1, wherein said display unit is a liquid crystal display unit.

6. A device as claimed in claim 1, wherein said display elements are arranged in the form of a sector of a circle.

7. A display device as defined in claim 4, wherein said microprocessor means includes fixed memory means for storing bit patterns corresponding to wave forms of said control signals, said microprocessor means responding to said input signal to read appropriate bit patterns out of said fixed memory means for loading into said first and second register means.

8. A display device as defined in claim 7, wherein each of said first and second register means include a plurality of stages providing respective outputs to respective ones of said row and column conductors, and wherein the control signal applied to any given row or column conductor is defined by a sequence of output bits from the shift register stage to which said given conductor is coupled.

* * * * *